United States Patent
Brady

(10) Patent No.: US 8,076,170 B2
(45) Date of Patent: Dec. 13, 2011

(54) BACKSIDE ILLUMINATED IMAGE SENSOR WITH SHALLOW BACKSIDE TRENCH FOR PHOTODIODE ISOLATION

(75) Inventor: Frederick T. Brady, Rochester, NY (US)

(73) Assignee: OmniVision Technologies, Inc., Santa Clara, CA (US)

( * ) Notice: Subject to any disclaimer, the term of this patent is extended or adjusted under 35 U.S.C. 154(b) by 0 days.

(21) Appl. No.: 12/944,268

(22) Filed: Nov. 11, 2010

(65) Prior Publication Data

US 2011/0059572 A1    Mar. 10, 2011

Related U.S. Application Data

(62) Division of application No. 12/169,810, filed on Jul. 9, 2008, now abandoned.

(51) Int. Cl.
*H01L 21/00*    (2006.01)
(52) U.S. Cl. ............ 438/57; 438/70; 438/401; 438/455; 257/E21.617
(58) Field of Classification Search ............... 438/57, 438/70, 401, 455, 458, 72; 257/E21.617
See application file for complete search history.

(56) References Cited

U.S. PATENT DOCUMENTS

| | | | |
|---|---|---|---|
| 5,227,313 A | 7/1993 | Gluck et al. | |
| 5,244,817 A | 9/1993 | Hawkins et al. | |
| 5,969,368 A | 10/1999 | Thompson et al. | |
| 6,168,965 B1 | 1/2001 | Malinovich et al. | |
| 6,429,036 B1 | 8/2002 | Nixon et al. | |
| 7,315,014 B2 | 1/2008 | Lee et al. | |
| 2006/0068586 A1 | 3/2006 | Pain | |
| 2007/0194397 A1 | 8/2007 | Adkisson et al. | |
| 2011/0073173 A1* | 3/2011 | Hwang | 136/255 |

FOREIGN PATENT DOCUMENTS

WO    2007/030226    3/2007

OTHER PUBLICATIONS

T. Joy et al, "Development of a Production-Ready, Back-Illuminated CMOS Image Sensor with Small Pixels," IEEE IEDM, Dec. 2007, pp. 1007-1010.

* cited by examiner

*Primary Examiner* — Jack Chen
(74) *Attorney, Agent, or Firm* — Blakely Sokoloff Taylor & Zafman LLP

(57) ABSTRACT

A backside illuminated image sensor comprises a sensor layer implementing a plurality of photosensitive elements of a pixel array, an oxide layer adjacent a backside surface of the sensor layer, and at least one dielectric layer adjacent a frontside surface of the sensor layer. The sensor layer further comprises a plurality of backside trenches formed in the backside surface of the sensor layer and arranged to provide isolation between respective pairs of the photosensitive elements. The backside trenches have corresponding backside field isolation implant regions formed in the sensor layer, and the resulting structure provides reductions in carrier recombination and crosstalk between adjacent photosensitive elements. The image sensor may be implemented in a digital camera or other type of digital imaging device.

16 Claims, 7 Drawing Sheets

BACKSIDE ILLUMINATED IMAGE SENSOR WITH SHALLOW BACKSIDE TRENCH FOR PHOTODIODE ISOLATION

CROSS REFERENCE TO RELATED APPLICATIONS

This is a divisional application of U.S. patent application Ser. No. 12/169,810 filed Jul. 9, 2008 now abandoned which is related to the inventions described in commonly-assigned U.S. patent application Ser. No. 12/169,709, entitled "Color Filter Array Alignment Mark Formation in Backside Illuminated Image Sensors," Ser. No. 12/169,791, entitled "Wafer Level Processing for Backside Illuminated Image Sensors," and Ser. No. 12/169,810, entitled "Backside Illuminated Image Sensor with Reduced Dark Current," which are concurrently filed herewith. The disclosures of these related applications are incorporated by reference herein in their entirety.

FIELD OF THE INVENTION

The present invention relates generally to electronic image sensors for use in digital cameras and other types of imaging devices, and more particularly to processing techniques for use in forming backside illuminated image sensors.

BACKGROUND OF THE INVENTION

A typical electronic image sensor comprises a number of light sensitive picture elements ("pixels") arranged in a two-dimensional array. Such an image sensor may be configured to produce a color image by forming an appropriate color filter array (CFA) over the pixels. Examples of image sensors of this type are disclosed in U.S. Patent Application Publication No. 2007/0024931, entitled "Image Sensor with Improved Light Sensitivity," which is incorporated by reference herein.

As is well known, an image sensor may be implemented using complementary metal-oxide-semiconductor (CMOS) circuitry. In such an arrangement, each pixel typically comprises a photodiode and other circuitry elements that are formed in a silicon sensor layer on a silicon substrate. One or more dielectric layers are usually formed above the silicon sensor layer and may incorporate additional circuitry elements as well as multiple levels of metallization used to form interconnects. The side of the image sensor on which the dielectric layers and associated levels of metallization are formed is commonly referred to as the frontside, while the side having the silicon substrate is referred to as the backside.

In a frontside illuminated image sensor, light from a subject scene is incident on the frontside of the image sensor, and the silicon substrate is relatively thick. However, the presence of metallization level interconnects and various other features associated with the dielectric layers on the frontside of the image sensor can adversely impact the fill factor and quantum efficiency of the image sensor.

A backside illuminated image sensor addresses the fill factor and quantum efficiency issues associated with the frontside dielectric layers by thinning or removing the thick silicon substrate and arranging the image sensor such that light from a subject scene is incident on the backside of the image sensor. Thus, the incident light is no longer impacted by metallization level interconnects and other features of the dielectric layers, and fill factor and quantum efficiency are improved.

However, in many backside illuminated image sensors, charge storage regions associated with the sensor photodiodes are located a substantial distance away from the backside surface. This is problematic in that many carriers generated by the photodiodes from incident light are lost before they can be collected, for example, due to recombination with other carriers or crosstalk between adjacent photodiodes.

Accordingly, a need exists for an improved backside illuminated image sensor which does not suffer from the excessive carrier loss problem described above.

SUMMARY OF THE INVENTION

Illustrative embodiments of the invention provide backside illuminated image sensors having reduced carrier recombination and crosstalk, and thus improved performance.

In accordance with one aspect of the invention, a process of forming a backside illuminated image sensor is provided. The process is a wafer level process for forming a plurality of image sensors each having a pixel array configured for backside illumination, with the image sensors being formed utilizing an image sensor wafer. The image sensor wafer comprises a substrate and a sensor layer formed over the substrate. The process includes the steps of forming backside trenches in a backside surface of the sensor layer, implanting a dopant into the sensor layer through the backside trenches so as to form backside field isolation implant regions corresponding to the backside trenches, filling the backside trenches, forming at least one antireflective layer over the filled backside trenches, and further processing the image sensor wafer to form the plurality of image sensors.

The image sensor wafer may be, for example, a silicon-on-insulator (SOI) wafer having a buried oxide layer arranged between the substrate and the sensor layer, or an epitaxial wafer having a P– sensor layer formed over a P+ substrate.

Prior to forming the backside trenches, a pad oxide layer may be formed over the sensor layer, and a pad nitride layer may be formed over the pad oxide layer. Alignment marks may then be formed that extend through the oxide and nitride layers and into the sensor layer. The backside trenches may be etched through the nitride and oxide layers, and a liner oxide layer may be formed within the backside trenches. The backside trenches may then be filled with a material such as oxide or polysilicon.

The antireflective layer may comprise an antireflective oxide layer formed on the backside surface of the sensor layer, and an antireflective nitride layer formed over the antireflective oxide layer. Prior to or after forming the antireflective oxide layer, a backside passivation implant operation may be performed.

The process may further include a backside well isolation implant operation. This may involve, for example, depositing a photoresist over the antireflective layer, patterning the photoresist to form openings over the backside trenches, and implanting a dopant through the openings to form backside well isolation implant regions corresponding to the backside trenches.

In one of the illustrative embodiments, the step of further processing the image sensor wafer to form the plurality of image sensors further comprises the steps of forming an oxide layer over the antireflective layer, attaching a temporary carrier wafer to a backside surface of the oxide layer, removing the substrate, forming photosensitive elements of the pixel arrays in the sensor layer, forming frontside trenches in a frontside surface of the sensor layer, forming frontside field isolation implant regions corresponding to the frontside trenches, filling the frontside trenches, forming frontside well isolation implant regions corresponding to the frontside trenches, forming at least one dielectric layer on the frontside surface of the sensor layer, attaching a handle wafer to a frontside surface of said at least one dielectric layer, removing the temporary carrier wafer, and separating the image sensor wafer into the plurality of image sensors.

In accordance with another aspect of the invention, a backside illuminated image sensor comprises a sensor layer implementing a plurality of photosensitive elements of a pixel array, an oxide layer adjacent a backside surface of the sensor layer, and at least one dielectric layer adjacent a frontside surface of the sensor layer. The sensor layer further comprises a plurality of backside trenches formed in the backside surface of the sensor layer and arranged to provide isolation between respective pairs of the photosensitive elements. The backside trenches have corresponding backside field isolation implant regions formed in the sensor layer.

A backside illuminated image sensor in accordance with the invention may be advantageously implemented in a digital camera or other type of imaging device, and provides improved performance in such a device without significantly increasing image sensor die size or cost.

BRIEF DESCRIPTION OF THE DRAWINGS

The above and other objects, features, and advantages of the present invention will become more apparent when taken in conjunction with the following description and drawings wherein identical reference numerals have been used, where possible, to designate identical features that are common to the figures, and wherein.

DETAILED DESCRIPTION OF THE INVENTION

The present invention will be illustrated herein in conjunction with particular embodiments of digital cameras, backside illuminated image sensors, and processing techniques for forming such image sensors. It should be understood, however, that these illustrative arrangements are presented by way of example only, and should not be viewed as limiting the scope of the invention in any way. Those skilled in the art will recognize that the disclosed arrangements can be adapted in a straightforward manner for use with a wide variety of other types of imaging devices and image sensors.

Figure 1:
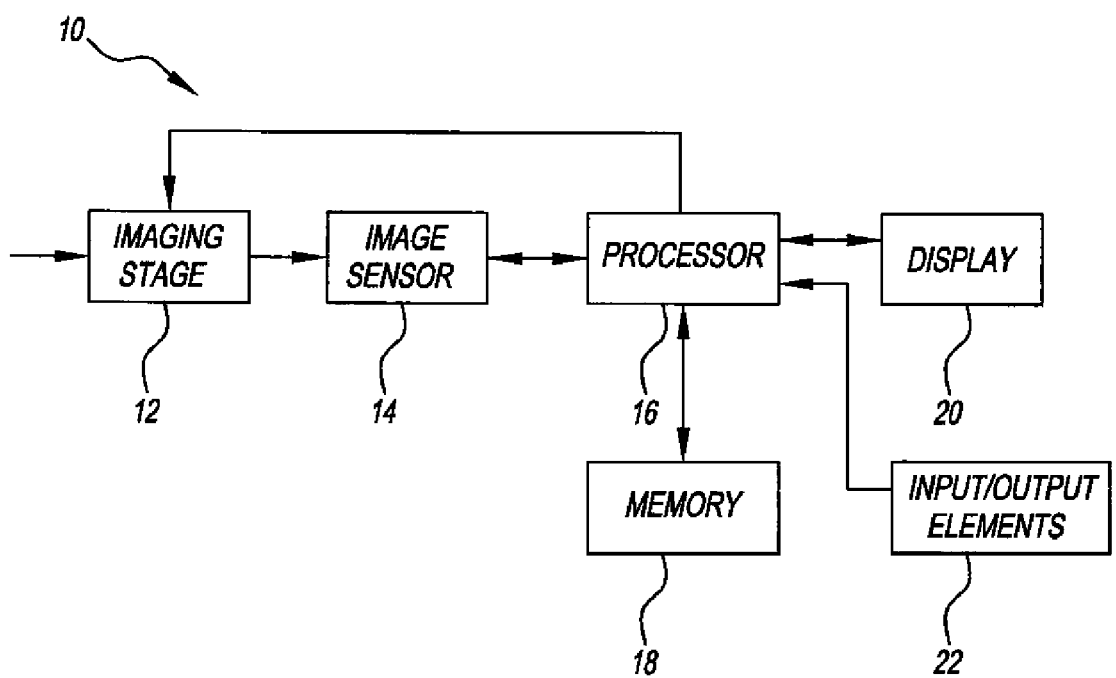
FIG. 1 is a block diagram of a digital camera having a backside illuminated image sensor configured in accordance with an illustrative embodiment of the invention.

FIG. 1 shows a digital camera 10 in an illustrative embodiment of the invention. In the digital camera, light from a subject scene is input to an imaging stage 12. The imaging stage may comprise conventional elements such as a lens, a neutral density filter, an iris and a shutter. The light is focused by the imaging stage 12 to form an image on an image sensor 14, which converts the incident light to electrical signals. The digital camera 10 further includes a processor 16, a memory 18, a display 20, and one or more additional input/output I/O elements 22.

Although shown as separate elements in the embodiment of FIG. 1, the imaging stage 12 may be integrated with the image sensor 14, and possibly one or more additional elements of the digital camera 10, to form a compact camera module.

The image sensor 14 is assumed in the present embodiment to be a CMOS image sensor, although other types of image sensors may be used in implementing the invention. More particularly, the image sensor 14 comprises a backside illuminated image sensor that is formed in a manner to be described below in conjunction with FIGS. 2 through 14. The image sensor generally comprises a pixel array having a plurality of pixels arranged in rows and columns and may include additional circuitry associated with sampling and readout of the pixel array, such as signal generation circuitry, signal processing circuitry, row and column selection circuitry, etc. This sampling and readout circuitry may comprise, for example, an analog signal processor for processing analog signals read out from the pixel array and an analog-to-digital converter for converting such signals to a digital form. These and other types of circuitry suitable for use in the digital camera 10 are well known to those skilled in the art and will therefore not be described in detail herein. Portions of the sampling and readout circuitry may be arranged external to the image sensor, or formed integrally with the pixel array, for example, on a common integrated circuit with photodiodes and other elements of the pixel array.

The image sensor 14 will typically be implemented as a color image sensor having an associated CFA pattern. Examples of CFA patterns that may be used with the image sensor 14 include those described in the above-cited U.S. Patent Application Publication No. 2007/0024931, although other CFA patterns may be used in other embodiments of the invention. As another example, a conventional Bayer pattern may be used, as disclosed in U.S. Pat. No. 3,971,065, entitled "Color Imaging Array," which is incorporated by reference herein.

The processor 16 may comprise, for example, a microprocessor, a central processing unit (CPU), an application-specific integrated circuit (ASIC), a digital signal processor (DSP), or other processing device, or combinations of multiple such devices. Various elements of the imaging stage 12 and the image sensor 14 may be controlled by timing signals or other signals supplied from the processor 16.

The memory 18 may comprise any type of memory, such as, for example, random access memory (RAM), read-only memory (ROM), Flash memory, disk-based memory, removable memory, or other types of storage elements, in any combination.

Functionality associated with sampling and readout of the pixel array and the processing of corresponding image data may be implemented at least in part in the form of software that is stored in memory 18 and executed by processor 16.

A given image captured by the image sensor 14 may be stored by the processor 16 in memory 18 and presented on display 20. The display 20 is typically an active matrix color liquid crystal display (LCD), although other types of displays may be used. The additional I/O elements 22 may comprise, for example, various on-screen controls, buttons or other user interfaces, network interfaces, memory card interfaces, etc.

Additional details regarding the operation of a digital camera of the type shown in FIG. 1 can be found, for example, in the above-cited U.S. Patent Application Publication No. 2007/0024931.

It is to be appreciated that the digital camera as shown in FIG. 1 may comprise additional or alternative elements of a type known to those skilled in the art. Elements not specifically shown or described herein may be selected from those known in the art. As noted previously, the present invention may be implemented in a wide variety of other types of digital cameras or imaging devices. Also, as mentioned above, certain aspects of the embodiments described herein may be implemented at least in part in the form of software executed by one or more processing elements of an imaging device. Such software can be implemented in a straightforward manner given the teachings provided herein, as will be appreciated by those skilled in the art.

The image sensor 14 may be fabricated on a silicon substrate or other type of substrate. In a typical CMOS image sensor, each pixel of the pixel array includes a photodiode and associated circuitry for measuring the light level at that pixel. Such circuitry may comprise, for example, transfer gates, reset transistors, select transistors, output transistors, and other elements, configured in a well-known conventional manner.

As indicated previously, an excessive carrier loss problem can arise in conventional backside illuminated image sensors, due to carrier recombination prior to collection as well as crosstalk between adjacent photodiodes. One possible approach to addressing this problem is to utilize a low-doped epitaxial layer for the sensor layer in which the photodiodes are formed, so as to extend the depletion regions associated with the respective photodiodes and thereby reduce carrier recombination. However, we have discovered that such an approach can lead to increased "dark" current and degradations in quantum efficiency. Techniques for addressing the carrier loss problem without increasing dark current or degrading quantum efficiency will now be described with reference to FIGS. 2 through 14. It should be noted that the cross-sectional views shown in these figures are simplified in order to clearly illustrate various aspects of the present invention, and are not necessarily drawn to scale. A given embodiment may include a variety of other features or elements that are not explicitly illustrated but would be familiar to one skilled in the art as being commonly associated with image sensors of the general type described.

The techniques illustrated in FIGS. 2 through 14 generally involve processing an image sensor wafer to form a plurality of image sensors each having a pixel array configured for backside illumination. Each of FIGS. 2 through 8 will show various process steps as applied to two separate image sensor wafers, one a silicon-on-insulator (SOI) wafer 200 and the other an epitaxial wafer 210. After completion of the process steps illustrated in FIG. 8, the resulting image sensor wafers have at that point have substantially the same structure. Thus, FIGS. 9 through 14 will show the remaining process steps as applied to only a single image sensor wafer. Although the SOI and epitaxial wafers 200 and 210 will be used to illustrate the invention, it is to be appreciated that other types of wafers may be used.

Figure 2:
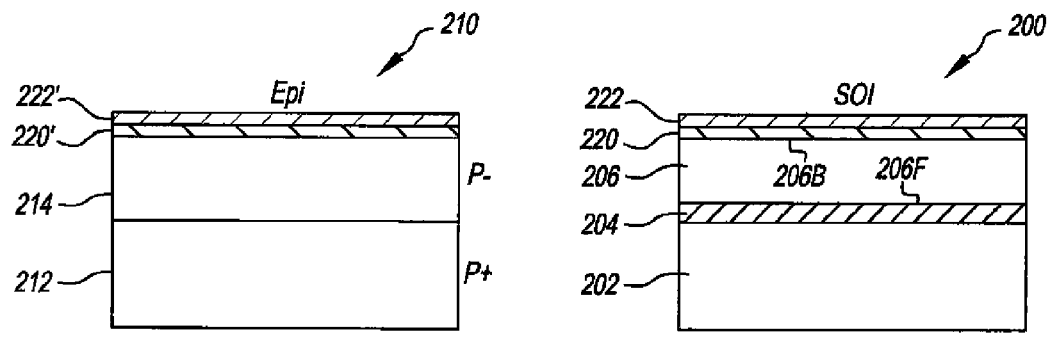
FIGS. 2 through 14 are cross-sectional views showing portions of a backside illuminated image sensor at various steps in an exemplary process for forming such an image sensor, in accordance with an illustrative embodiment of the invention.

The portions of the image sensor wafers 200 and 210 as shown in FIG. 2 generally correspond to a particular one of the image sensors, and may be viewed as including a pixel array area surrounded by periphery areas. The periphery areas may include or be associated with bond pad areas, or other portions of the image sensor.

The image sensor wafer 200 or 210 also has a frontside and a backside. With reference to FIG. 2, the backside of these image sensor wafers corresponds generally to the top of the wafers. Thus, in the completed image sensor wafer shown in FIG. 14, light from a subject scene will be incident on the photodiodes or other photosensitive elements of the pixel array through the side identified in that figure as the backside, which again is the top of the wafer. The terms "frontside" and "backside" will be used herein to denote particular sides of an image sensor wafer or an image sensor formed from such a wafer, as well as sides of particular layers of the image sensor wafer or corresponding image sensor.

It should be noted that terms such as "on" or "over" when used in conjunction with layers of an image sensor wafer or corresponding image sensor are intended to be construed broadly, and therefore should not be interpreted to preclude the presence of one or more intervening layers or other intervening image sensor features or elements. Thus, a given layer that is described herein as being formed on or formed over another layer may be separated from the latter layer by one or more additional layers.

Referring now to FIG. 2, the SOI image sensor wafer 200 comprises a silicon substrate 202, a buried oxide (BOX) layer 204 formed on the substrate, and a silicon sensor layer 206 formed on the buried oxide layer. The epitaxial image sensor wafer 210 comprises a P+ substrate 212, and a P− sensor layer 214 formed over the P+ substrate. As indicated above, various layers of an image sensor wafer may be described herein as having frontside and backside surfaces. For example, the sensor layer 206 has a frontside surface 206F and a backside surface 206B.

For the remaining description of FIGS. 2 through 8, the process will be described primarily with reference to the SOI image sensor wafer 200, with the understanding that similar steps are applied to the epitaxial wafer 210, as illustrated in these figures. Similar reference numerals will be used to denote corresponding elements in the SOI and epitaxial wafers, with those of the latter wafer being distinguished from those of the former by a prime symbol ('). Thus, for example, element 220 in the SOI wafer corresponds to element 220' in the epitaxial wafer.

In the steps illustrated in FIG. 2, a pad oxide layer 220 is formed over the sensor layer 206 of the SOI wafer 200, and a pad nitride layer 222 is formed over the pad oxide layer 220. As will be seen, portions of these layers in a pixel array area of an image sensor are eventually removed, but other portions are utilized to form, for example, bond pad structures in periphery areas of the image sensor.

Figure 3:
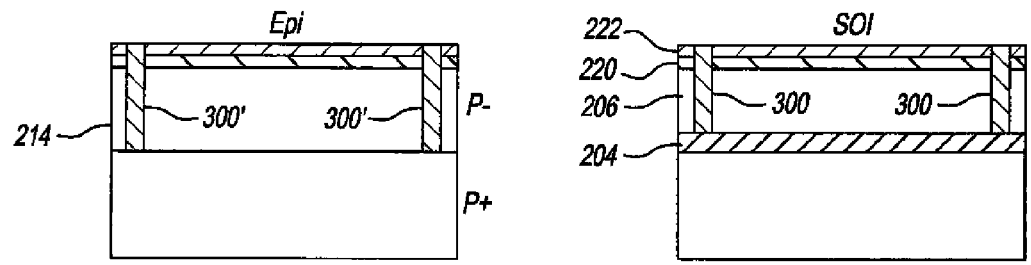

As shown in FIG. 3, alignment marks 300 are patterned and formed, which will generally involve lithography operations such as photoresist deposition followed by exposing, developing and etching. The alignment marks are patterned in accordance with a desired alignment mark pattern, which will generally depend upon the particular type of lithography equipment being used to process the image sensor wafer. In this example, the alignment marks 300 extend through the pad oxide and nitride layers 220, 222 and sensor layer 206 to an underlying surface of the buried oxide layer 204. Thus, the alignment marks extend through the entire sensor layer 206. These alignment marks can be used to provide alignment between frontside and backside features, and to align CFA elements and their associated microlenses to corresponding photodiodes or other photosensitive elements of the pixel array.

The alignment marks 300 may comprise polysilicon. Advantageous techniques for forming polysilicon alignment marks of this type in a backside illuminated image sensor are disclosed in the above-cited U.S. patent application Ser. No. 12/169,709, although a wide variety of other techniques may be used to form alignment marks 300.

Figure 4:
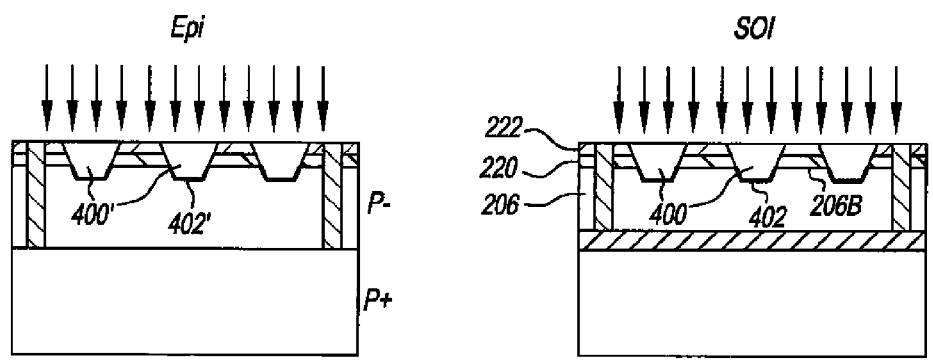

Backside trenches 400 are then formed in the backside surface 206B of the sensor layer 206, as illustrated in FIG. 4. A dopant is implanted into the sensor layer through the backside trenches 400 as indicated by the downward pointing arrows so as to form backside field isolation implant regions 402. The backside trenches in this embodiment are formed by etching the trenches through the nitride and oxide layers 222, 220. The trenches in the illustrative embodiment are shallow trenches, and may have a depth of approximately 0.1 to 0.5 micrometers (µm). The trench width is typically about 0.1 to 0.2 µm, but will generally depend on the size of the photodiodes, which may vary from implementation to implementation. A narrower width is generally preferred in terms of providing an improved photoresponse.

Figure 14:
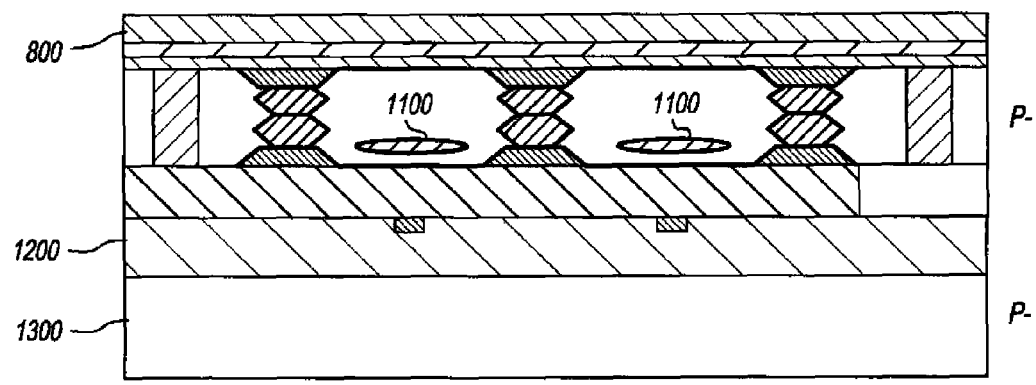

The backside trenches 400 and their associated field isolation implant regions 402 serve to dielectrically isolate the backside of each pixel of the pixel array, which results in less carrier recombination and reduced crosstalk in the completed structure shown in FIG. 14.

The backside trenches 400 may be arranged so as to appear as a grid in a top-down plan view of the pixel array area of a given image sensor. In such an arrangement, each photodiode may be located in one of the grid positions so as to be substantially surrounded by backside trenches.

A liner oxide layer may be formed within the backside trenches 400. Typically the liner oxide will have a thickness of about 50 to 150 Angstroms. The field isolation implant can be done before or after the formation of the liner oxide layer.

The dopant used for the field isolation implant is an n-type dopant, such as arsenic or phosphorus, if the pixel array is based on p-type metal-oxide-semiconductor (PMOS) circuitry, while a p-type dopant such as boron or indium would be used if the pixel array is based on n-type metal-oxide-semiconductor (NMOS) circuitry. Typical concentration ranges for the field isolation implant are from about $5\times10^{12}$ to $5\times10^{13}$ atoms/cm$^3$.

Figure 5:
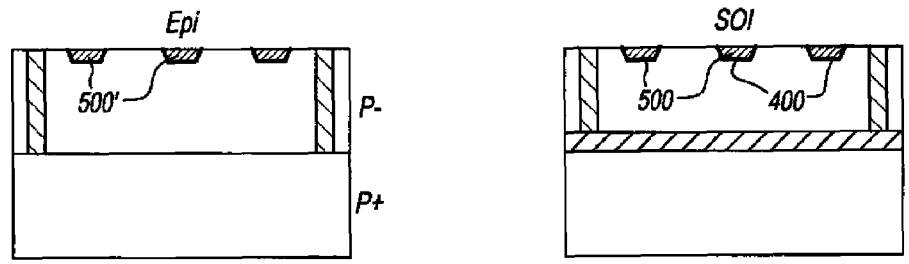

Referring now to FIG. 5, the backside trenches 400 are filled with a material 500 and planarized, and the pad oxide and nitride layers 220, 222 are removed. The fill material 500 may comprise, for example, oxide or polysilicon. Doped polysilicon can be used to absorb blue light between pixels and further reduce crosstalk. However, the quantum efficiency for the blue light will also be lower when using doped polysilicon as a fill material.

Figure 6:
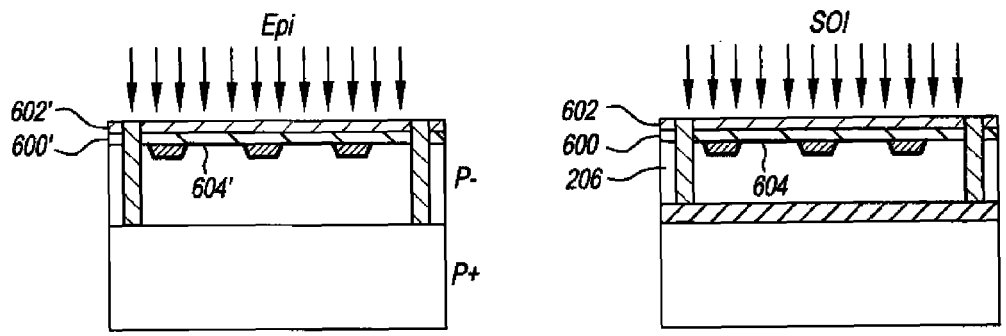

Antireflective layers are then formed over the filled backside trenches of the sensor layer 206, as illustrated in FIG. 6. More particularly, an antireflective oxide layer 600 is formed on the backside surface of the sensor layer, and an antireflective nitride layer 602 is formed over the antireflective oxide layer 600. The antireflective oxide layer has a thickness of approximately 50 Angstroms and the antireflective nitride layer has a thickness of approximately 500 Angstroms, although other values can be used. The antireflective oxide and nitride layers help to improve quantum efficiency.

The downward pointing arrows in FIG. 6 illustrate the performance of a backside passivation implant operation in conjunction with the formation of the antireflective oxide layer 600. This passivation implant operation may performed before or after the formation of the oxide layer 600, and creates a passivation implant region 604 that serves to quench surface states at the backside surface of the sensor layer 206.

Like the field isolation implant of FIG. 4, the backside passivation implant of FIG. 6 will use an n-type dopant for a PMOS pixel array or a p-type dopant for an NMOS pixel array. Also, suitable concentrations for the passivation implant are the same as those identified above for the field isolation implant, that is, from about $5\times10^{12}$ to $5\times10^{13}$ atoms/cm$^3$.

Figure 7:
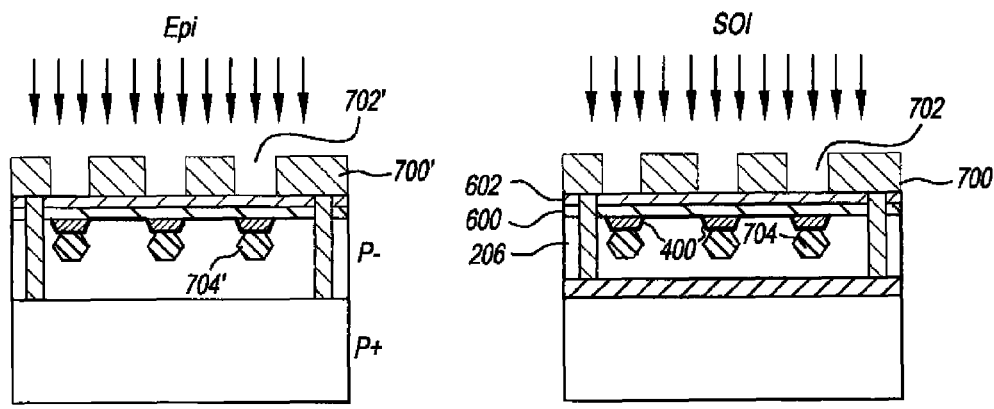

FIG. 7 illustrates the performance of a backside well isolation implant operation. Such an operation is considered optional, but can provide additional lateral isolation between adjacent photodiodes to be formed in the sensor layer 206. In this example, a photoresist 700 is deposited over the antireflective nitride layer 602 and patterned to form openings 702 over respective ones of the backside trenches 400. Then, a well isolation implant operation is performed, as indicated by the downward pointing arrows, to implant a dopant through the openings 702. This operation forms backside well isolation implant regions 704 associated with the respective backside trenches. Forming the regions 704 from the backside rather than the frontside allows narrower regions to be formed, which can enhance performance.

The dopant used for the well isolation implant, like those used for the other implants previously described, will be an n-type dopant for a PMOS pixel array or a p-type dopant for an NMOS pixel array. Suitable concentrations for the well isolation implant are from about $5\times10^{11}$ to $5\times10^{13}$ atoms/cm$^3$.

Figure 8:
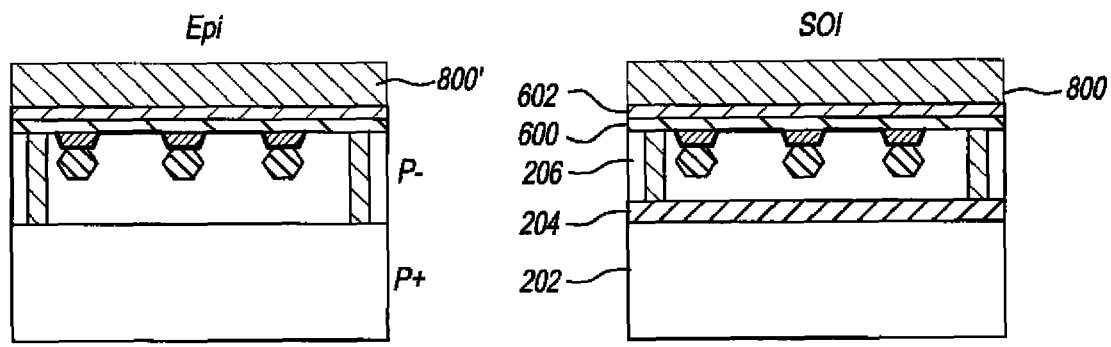

Any remaining portions of the photoresist 700 are then stripped, and an oxide layer 800 is deposited over the antireflective nitride layer 602 as illustrated in FIG. 8. The oxide layer 800 may be deposited to a thickness of about 0.1 to 0.5 µm. The backside surface of the oxide layer 800 may then be subject to a chemical-mechanical polishing (CMP) operation to prepare the surface for bonding of a temporary carrier wafer.

Figure 9:
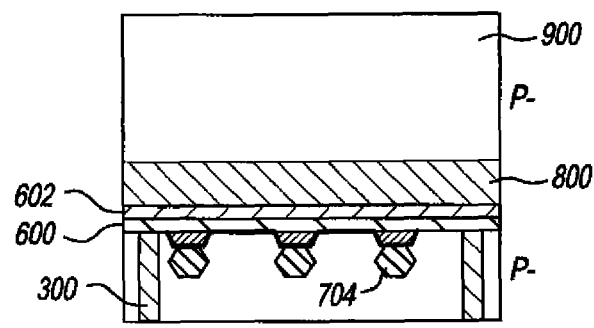

FIG. 9 shows the image sensor wafer structure after a temporary carrier wafer 900 is bonded to the backside surface of the oxide layer 800 and the substrate 202 and buried oxide layer 204 are removed. The substrate may be removed using, for example, grinding, polishing or etching techniques, in any combination. For the SOI wafer 200, the substrate 202 is removed down to the buried oxide layer 204, and then the buried oxide layer is removed. For the epitaxial wafer 210, the substrate removal process is configured to terminate when the alignment marks 300' are reached. As indicated previously, because the structures formed from the SOI wafer 200 and the epitaxial wafer 210 are at this point substantially the same, the remaining portions of the process will be described with reference to a single image sensor wafer structure. In this structure as shown in FIG. 9, the sensor layer 206 or 214 is more particularly identified, by way of illustrative example, as a P– sensor layer.

The backside temporary carrier wafer 900 may comprise, for example, a type of wafer commonly referred to as a handle wafer. The temporary carrier wafer may be attached to the image sensor wafer using epoxy or another suitable adhesive.

Although the temporary carrier wafer is shown as a P– wafer in this embodiment, this is by way of example only, and other types of dopings may be used. Also, the sensor layer may use dopings other than those illustrated in the figure. For example, the sensor layer as illustrated in FIG. 9 has a P– doping, but the processing operations could be modified in a straightforward manner to use an alternative doping such as an N– doping. Other doping indications shown adjacent the cross-sectional views in FIGS. 2 through 14 may be similarly varied in other embodiments, as will be appreciated by those skilled in the art.

Figure 10:
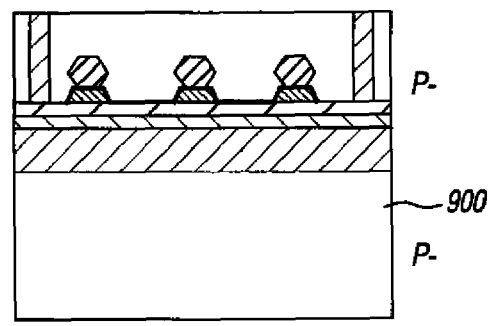

FIG. 10 shows the image sensor wafer flipped over for further processing.

Figure 11:
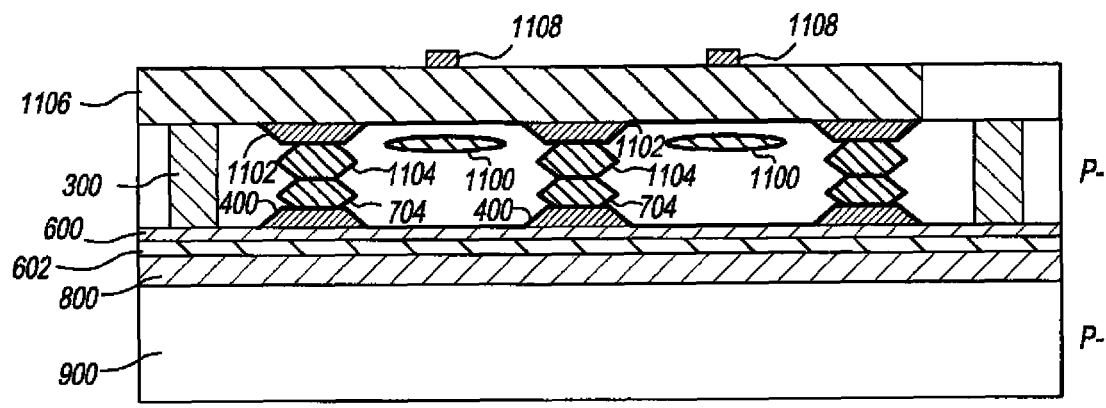

As illustrated in FIG. 11, this further processing generally involves forming photosensitive elements 1100 of the pixel arrays in the sensor layer 206 or 214, forming frontside trenches 1102 in a frontside surface of the sensor layer, forming frontside field isolation implant regions corresponding to the frontside trenches, filling the frontside trenches, forming frontside well isolation implant regions 1104 corresponding to the frontside trenches, and forming a dielectric layer 1106 on the frontside surface of the sensor layer. As indicated previously herein, the photosensitive elements of the pixel arrays in the illustrative embodiments comprise photodiodes.

The frontside trenches 1102 and their associated implant regions may be formed using techniques similar to those described above for formation of the backside trenches 400 and their associated implant regions.

The dielectric layer 1106 in this embodiment comprises multiple layers of dielectric material and may include, for example, an interlayer dielectric (ILD) and an intermetal dielectric (IMD) that separates multiple levels of metallization. Various image sensor features such as interconnects, gates or other circuitry elements may be formed within the dielectric layer 1106 using conventional techniques. Although only a single dielectric layer 1106 is shown in the diagram of FIG. 11, other embodiments may comprise multiple dielectric layers, possibly separated from one another by one or more intervening layers. Metal conductors 1108 formed on a frontside surface of the dielectric layer 1106 represent the last metal layer in the image sensor wafer.

Figure 12:
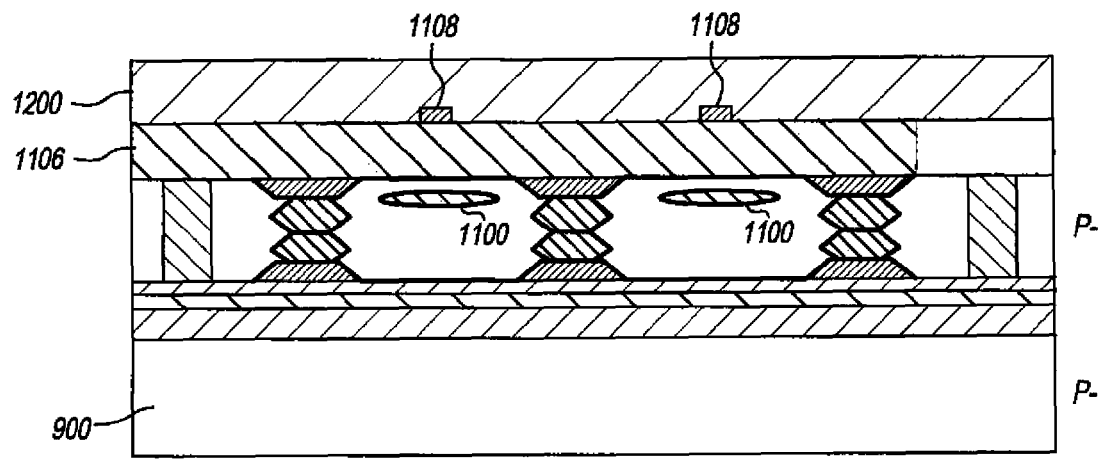

An oxide layer 1200 is deposited over the dielectric layer 1106 and metal conductors 1108, and then planarized using a CMP operation. FIG. 12 shows the resulting structure.

Figure 13:
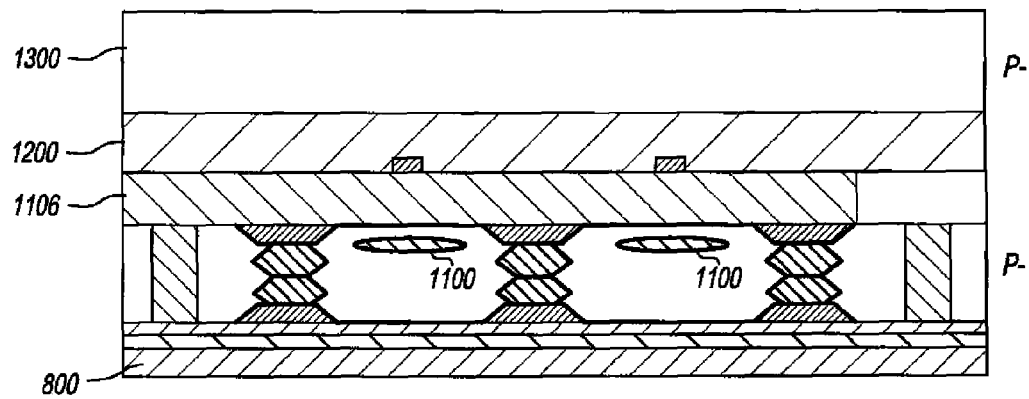

In FIG. 13, a frontside handle wafer 1300 is attached to the oxide layer 1200 above the last metal layer, and the backside temporary carrier wafer 900 is removed. The handle wafer 1300 may be attached using, for example, low temperature oxide-to-oxide bonding.

FIG. 14 shows the image sensor wafer flipped again for further backside processing. The frontside handle wafer 1300 serves as a substrate, providing support for the structure for the further backside processing. This further processing may include, for example, forming CFAs on the backside surface of the oxide layer 800 for respective ones of the pixel arrays. Generally, each of the pixel arrays of the image sensor wafer has a corresponding CFA which includes color filter elements that are arranged over respective photosensitive elements 1100 of the sensor layer. Microlenses may also be formed over respective color filter elements of the CFAs. The CFAs and their associated microlenses are not shown in the figure, but can be arranged in a well-known conventional manner.

The color filter elements and associated microlenses are aligned with the alignment marks 300, so as to provide accurate alignment between the photodiodes of the sensor layer and the corresponding color filter elements of the CFA.

The resulting processed image sensor wafer is then diced into a plurality of image sensors configured for backside illumination, one of which is the image sensor 14 in digital camera 10. The wafer dicing operation will be described in greater detail below in conjunction with FIG. 15. The handle wafer 1300 in this embodiment is not removed prior to dicing, but instead serves as a permanent handle wafer, portions of which remain part of respective ones of the image sensors that are separated from one another in the dicing operation.

In an alternative embodiment, a second temporary carrier wafer may be used in place of the handle wafer 1300. The second temporary carrier wafer, like the first temporary carrier wafer 900, may be attached using epoxy or another suitable adhesive. After attachment of the second temporary carrier wafer, a transparent cover sheet comprising transparent covers overlying respective ones of the CFAs may be attached to the backside surface of the image sensor wafer prior to removing the second temporary carrier wafer. Each such glass cover may comprise a central cavity arranged over its corresponding CFA and further comprise peripheral supports secured to the backside surface of the oxide layer 800 via epoxy. The transparent cover sheet may be formed of glass or another transparent material. Such a cover sheet may be attached to the wafer as a single sheet which is divided into separate covers when the image sensors are diced from the wafer. Further details regarding the use of such a temporary carrier wafer and transparent cover sheet may be found in the above-cited U.S. patent application Ser. No. 12/169,791. However, it is to be appreciated that use of such elements and associated processing operations is not a requirement of the present invention.

Other illustrative operations that may be performed in a given embodiment of the invention include, for example, the formation of redistribution layer (RDL) conductors, the formation of a passivation layer, and formation of contact metallizations.

Figure 15:
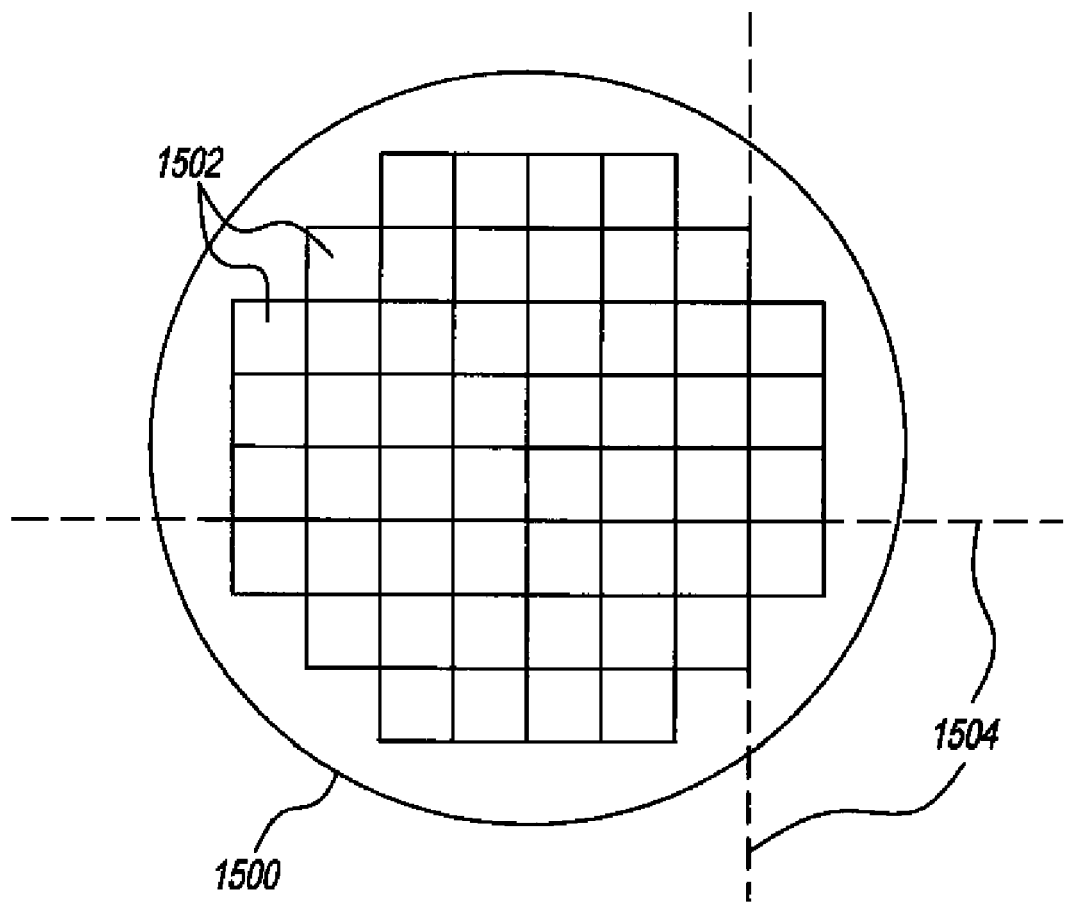
FIG. 15 is a plan view of an image sensor wafer comprising multiple image sensors formed using the exemplary process of FIGS. 2 through 14.

As indicated above, the processing operations illustrated in FIGS. 2 through 14 are wafer level processing operations applied to an image sensor wafer. FIG. 15 shows a plan view of an image sensor wafer 1500 comprising a plurality of image sensors 1502. The image sensors 1502 are formed through wafer level processing of the image sensor wafer 1500 as described in conjunction with FIGS. 2 through 14. The image sensors are then separated from one another by dicing the wafer along dicing lines 1504. A given one of the image sensors 1502 corresponds to image sensor 14 in digital camera 10 of FIG. 1.

The above-described illustrative embodiments advantageously provide an improved processing arrangement for forming a backside illuminated image sensor. For example, the process described in conjunction with FIGS. 2 through 14 provides additional backside features, such as shallow backside trenches with associated backside field isolation, passivation and well isolation implants, that substantially reduce carrier recombination and crosstalk between adjacent photodiodes. This provides a backside illuminated image sensor that exhibits improved performance in terms of an enhanced ability to detect incident light, without significantly increasing image sensor die size or cost.

The invention has been described in detail with particular reference to certain illustrative embodiments thereof, but it will be understood that variations and modifications can be effected within the scope of the invention as set forth in the appended claims. For example, the invention can be implemented in other types of image sensors and digital imaging devices, using alternative materials, wafers, layers, process steps, etc. Thus, various process parameters such as layer thicknesses and dopant concentrations described in conjunction with the illustrative embodiments can be varied in alternative embodiments. These and other alternative embodiments will be readily apparent to those skilled in the art.

PARTS LIST 10 digital camera
12 imaging stage
14 backside illuminated image sensor
16 processor
18 memory
20 display
22 input/output (I/O) elements
200 silicon-on-insulator (SOI) wafer
202 substrate
204 buried oxide (BOX) layer
206 sensor layer
206B sensor layer backside surface
206F sensor layer frontside surface
210 epitaxial wafer
212 substrate
214 sensor layer
220 pad oxide layer
222 pad nitride layer 300 alignment marks
400 backside trench
402 field isolation implant region
500 trench fill material
600 antireflective oxide layer
602 antireflective nitride layer
604 backside passivation implant region
700 photoresist
702 openings
704 backside well isolation implant region
800 backside oxide layer
900 backside temporary carrier wafer
1100 photosensitive elements
1102 frontside trench
1104 frontside well isolation implant region
1106 dielectric layer
1108 last metal layer conductor
1200 oxide layer
1300 frontside handle wafer
1500 image sensor wafer
1502 image sensors
1504 dicing lines

The invention claimed is:

1. A wafer level processing method for forming a plurality of image sensors each having a pixel array configured for backside illumination, the image sensors being formed utilizing an image sensor wafer, the image sensor wafer comprising a substrate and a sensor layer formed over the substrate, the method comprising:
    forming backside trenches in a backside surface of the sensor layer;
    implanting a dopant into the sensor layer through the backside trenches so as to form backside field isolation implant regions corresponding to the backside trenches;
    filling the backside trenches with a material;
    forming at least one antireflective layer over the filled backside trenches;
    attaching a temporary carrier wafer to the backside surface and removing the substrate; and
    after removing the substrate, further processing the image sensor wafer to form the plurality of image sensors including the pixel arrays for the plurality of image sensors.

2. The method of claim 1 wherein the image sensor wafer comprises a silicon-on-insulator (SOY) wafer having a buried oxide layer arranged between the substrate and the sensor layer.

3. The method of claim 1 wherein the image sensor wafer comprises an epitaxial wafer having a P− sensor layer formed over a P+ substrate.

4. The method of claim 1 further comprising:
    forming an oxide layer over the sensor layer;
    forming a nitride layer over the oxide layer;
    forming alignment marks that extend through the oxide and nitride layers and into the sensor layer.

5. The method of claim 4 wherein forming backside trenches in the backside surface of the sensor layer further comprises etching the backside trenches through the nitride and oxide layers.

6. The method of claim 1 further comprising forming a liner oxide layer within the backside trenches prior to filling the backside trenches with a material.

7. The method of claim 1 wherein filling the backside trenches with a material comprises filling the backside trenches with one of oxide and polysilicon.

8. The method of claim 1 wherein forming at least one antireflective layer over the filled backside trenches on the backside surface of the sensor layer further comprises:
    forming an antireflective oxide layer on the backside surface of the sensor layer; and
    forming an antireflective nitride layer over the antireflective oxide layer.

9. The method of claim 1 further comprising implanting a dopant into the sensor layer to form backside passivation implant regions prior to forming at least one antireflective layer over the filled backside trenches.

10. The method of claim 1, further comprising implanting a dopant into the sensor layer to form backside passivation implant regions after forming at least one antireflective layer over the filled backside trenches.

11. The method of claim 8 wherein the antireflective oxide layer has a thickness of approximately 50 Angstroms and the antireflective nitride layer has a thickness of approximately 500 Angstroms.

12. The method of claim 1 further comprising:
    depositing a photoresist over the at least one antireflective layer;
    patterning the photoresist to form openings over the backside trenches; and
    implanting a dopant through the openings to form backside well isolation implant regions corresponding to the backside trenches.

13. The method of claim 1 further comprising forming an oxide layer over said at least one antireflective layer prior to attaching the temporary carrier wafer, wherein the temporary carrier wafer is attached to a backside surface of the oxide layer.

14. The method of claim 1 wherein further processing the image sensor wafer to form the plurality of image sensors including the pixel arrays further comprises:
    forming photosensitive elements of the pixel arrays in the frontside surface the sensor layer;
    forming frontside trenches in the frontside surface of the sensor layer;
    forming frontside field isolation implant regions corresponding to the frontside trenches;
    filling the frontside trenches with a material;
    forming frontside well isolation implant regions corresponding to the frontside trenches;
    forming at least one dielectric layer on the frontside surface of the sensor layer; and
    attaching a handle wafer to a frontside surface of said at least one dielectric layer.

15. The method of claim 14 further comprising:
    removing the temporary carrier wafer after the handle wafer is attached to the frontside surface; and
    separating the image sensor wafer into the plurality of image sensors.

16. The method of claim 14 wherein said at least one dielectric layer comprises an interlayer dielectric and further comprises an intermetal dielectric separating multiple levels of metallization.

* * * * *

UNITED STATES PATENT AND TRADEMARK OFFICE
CERTIFICATE OF CORRECTION

| | | |
|---|---|---|
| PATENT NO. | : 8,076,170 B2 | Page 1 of 1 |
| APPLICATION NO. | : 12/944268 | |
| DATED | : December 13, 2011 | |
| INVENTOR(S) | : Brady | |

It is certified that error appears in the above-identified patent and that said Letters Patent is hereby corrected as shown below:

In Column 11, line 45, (claim 2, line 2) delete "(SOY)" and replace with -- (SOI) --.

Signed and Sealed this
Twentieth Day of March, 2012

David J. Kappos
*Director of the United States Patent and Trademark Office*